(12) United States Patent  (10) Patent No.: US 7,780,477 B2
Hubert et al.  (45) Date of Patent: Aug. 24, 2010

(54) ADAPTER SYSTEM FOR USE WITH AN EXPRESSCARD SLOT

(75) Inventors: Jonathan Hubert, Los Gatos, CA (US); Jason P. Hanlon, Scotts Valley, CA (US); Matthijs Hutten, Redwood City, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/771,730

(22) Filed: Jun. 29, 2007

(65) Prior Publication Data

US 2009/0004921 A1  Jan. 1, 2009

(51) Int. Cl.
  *H05K 1/00* (2006.01)
(52) U.S. Cl. .......... 439/638; 439/630; 439/945
(58) Field of Classification Search .......... 439/638, 439/945, 630, 946
  See application file for complete search history.

(56) References Cited

U.S. PATENT DOCUMENTS

| | | | |
|---|---|---|---|
| 5,581,127 A | 12/1996 | Shinohara | |
| 5,905,253 A | 5/1999 | Ito et al. | |
| 6,101,372 A | 8/2000 | Kubo | |
| 6,234,844 B1 | 5/2001 | Somerville et al. | |
| 6,264,506 B1 | 7/2001 | Yasufuku et al. | |
| 6,567,273 B1 | 5/2003 | Liu et al. | |
| 6,574,112 B2 | 6/2003 | Washino et al. | |
| 6,692,268 B2 | 2/2004 | Kung et al. | |
| 6,725,286 B2 | 4/2004 | Takahashi | |
| 6,736,678 B2 | 5/2004 | Yao | |
| 6,768,644 B2 | 7/2004 | Kakinoki et al. | |
| 6,808,424 B2 | 10/2004 | Kaneshiro et al. | |
| 6,908,038 B1 | 6/2005 | Le | |
| 6,993,618 B2 | 1/2006 | Chen et al. | |
| 7,059,913 B1* | 6/2006 | Chen | 439/638 |
| 7,075,793 B2 | 7/2006 | Le et al. | |
| 7,092,256 B1 | 8/2006 | Salazar et al. | |
| 7,108,557 B2 | 9/2006 | Kikuchi et al. | |
| 7,125,258 B2 | 10/2006 | Nakakubo et al. | |
| 7,172,430 B2 | 2/2007 | Kojima | |
| 7,182,645 B2 | 2/2007 | Shimizu et al. | |
| 7,217,150 B2 | 5/2007 | Lekic et al. | |
| 7,265,989 B2 | 9/2007 | Son et al. | |
| 7,281,953 B1* | 10/2007 | Jochym et al. | 439/638 |
| 7,300,314 B2 | 11/2007 | Kim | |
| 7,306,467 B2 | 12/2007 | Morino et al. | |
| 7,326,086 B1 | 2/2008 | Lee | |
| 7,341,461 B1 | 3/2008 | Yen et al. | |

(Continued)

FOREIGN PATENT DOCUMENTS

EP   1587020 A   10/2005

(Continued)

OTHER PUBLICATIONS

U.S. Appl. No. 11/771,717, filed Jun. 29, 2007.

(Continued)

*Primary Examiner*—Gary F. Paumen
(74) *Attorney, Agent, or Firm*—Vierra Magen Marcus & DeNiro LLP

(57) ABSTRACT

An adapter system is disclosed including a pair of adapters operating in conjunction with each other to allow a variety of different, off-the-shelf memory cards to be used within the ExpressCard slot.

51 Claims, 7 Drawing Sheets

U.S. PATENT DOCUMENTS

| | | | |
|---|---|---|---|
| 7,354,312 | B2 | 4/2008 | Chuang |
| 7,367,511 | B2 | 5/2008 | Thornton et al. |
| 7,382,625 | B2 * | 6/2008 | Thornton et al. ............ 361/737 |
| 7,385,827 | B2 * | 6/2008 | Klatt .......................... 361/737 |
| 7,416,451 | B2 | 8/2008 | Tanaka et al. |
| 7,460,076 | B2 | 12/2008 | Hayes et al. |
| 7,475,816 | B1 | 1/2009 | Rochelo |
| 7,534,116 | B2 | 5/2009 | Ho |
| 2002/0002061 | A1 | 1/2002 | Miyasaka et al. |
| 2002/0076954 | A1 | 6/2002 | Chen et al. |
| 2003/0201322 | A1 | 10/2003 | Wu |
| 2004/0087213 | A1 | 5/2004 | Kao |
| 2005/0066102 | A1 | 3/2005 | Yamamoto et al. |
| 2005/0114587 | A1 | 5/2005 | Chou et al. |
| 2005/0258243 | A1 | 11/2005 | Hsieh |
| 2008/0123274 | A1 | 5/2008 | Desrosiers et al. |
| 2008/0168204 | A1 | 7/2008 | Sultenfuss et al. |
| 2008/0228986 | A1 | 9/2008 | Lodolo |
| 2008/0270663 | A1 | 10/2008 | Fry et al. |

FOREIGN PATENT DOCUMENTS

| | | |
|---|---|---|
| WO | 9744867 A | 11/1997 |
| WO | 2005106781 A | 11/2005 |

OTHER PUBLICATIONS

Office Action mailed Dec. 28, 2007 in U.S. Appl. No. 11/620,530 filed Jan. 5, 2007.
Response to Office Action dated Feb. 14, 2008 in U.S. Appl. No. 11/620,519 filed Jan. 5, 2007.
Response to Office Action dated Apr. 25, 2008, U.S. Appl. No. 11/620,530, filed Jan. 5, 2007.
Office action dated May 13, 2008, U.S. Appl. No. 11/771,717, filed Jun. 29, 2007.
Final Office Action dated Aug. 7, 2008 in U.S. Appl. No. 11/620,530.
Response to Office Action dated Aug. 13, 2008 in U.S. Appl. No. 11/771,717.
International Search Report and Written Opinion dated Jul. 3, 2008 in PCT Application No. PCT/US2007/089069.
Office Action dated Jul. 9, 2008 in U.S. Appl. No. 11/620,519.
Response to Office Action dated Sep. 30, 2008 in U.S. Appl. No. 11/620,519.
Final Office Action dated Nov. 21, 2008 in U.S. Appl. No. 11/771,717.
Office Action dated Dec. 11, 2008, U.S. Appl. No. 11/771,756.
Office Action dated Dec. 29, 2008, U.S. Appl. No. 12/103,533.
International Search Report and Written Opinion, International No. PCT/US2008/068531.
Office Action dated Jan. 8, 2009, U.S. Appl. No. 11/620,519.
Response to Office Action filed Mar. 30, 2009 in U.S. Appl. No. 12/103,533.
Office Action dated Apr. 1, 2009 in U.S. Appl. No. 11/771,744.
Response to Office Action filed Apr. 8, 2009 in U.S. Appl. No. 11/620,159.
Office Action dated May 27, 2009 in U.S. Appl. No. 11/771,756.
Response to Office Action filed Jun. 25, 2009 in U.S. Appl. No. 11/771,744.
Response to Office Action filed Jun. 30, 2009 in U.S. Appl. No. 11/771,756.
Office Action dated Jul. 7, 2009 in U.S. Appl. No. 11/620,519.
Office Action dated Jul. 7, 2009, in U.S. Appl. No. 11/771,767.
Office Action dated Jul. 10, 2009 in U.S. Appl. No. 12/103,533.
Response to Office Action filed Aug. 3, 2009 in U.S. Appl. No. 11/771,767.
Office Action dated Sep. 2, 2009 in U.S. Appl. No. 11/771,744.
Notice of Allowance and Fee(s) Due dated Oct. 1, 2009 in U.S. Appl. No. 11/771,756.
Notice of Allowance and Fee(s) Due dated Dec. 3, 2009 in U.S. Appl. No. 11/771,767.
Response to Office Action filed Dec. 2, 2009 in U.S. Appl. No. 11/771,744.
Response to Office Action filed Feb. 22, 2010 in U.S. Appl. No. 11/771,752.
Office Action dated Apr. 21, 2010, U.S. Appl. No. 11/711,752.
Notice of Allowance and Fee(s) Due dated Apr. 23, 2010, U.S. Appl. No. 11/771,774.

* cited by examiner

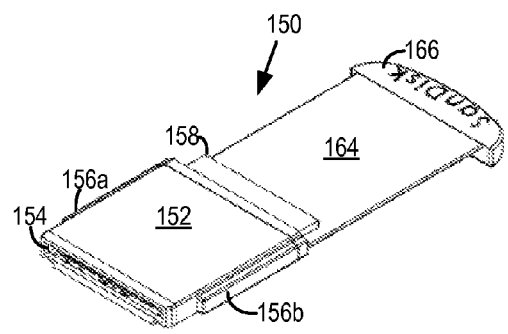
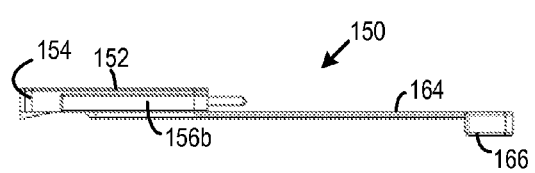
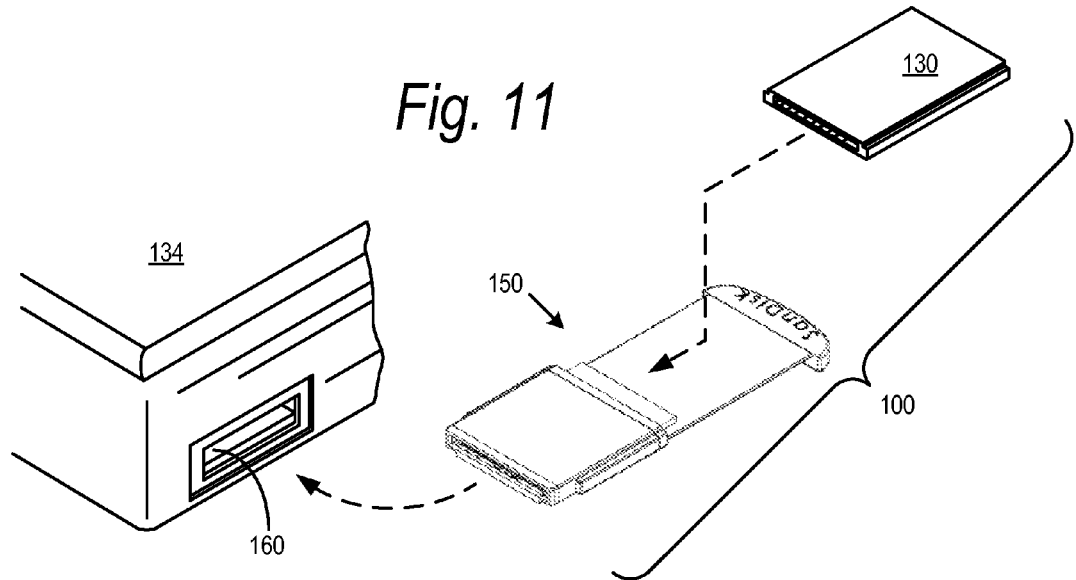

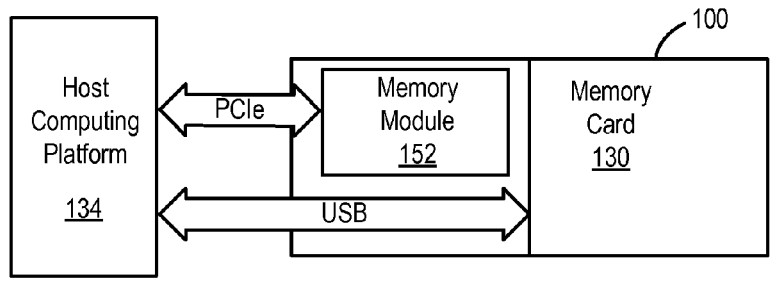
Fig. 12
Fig. 13
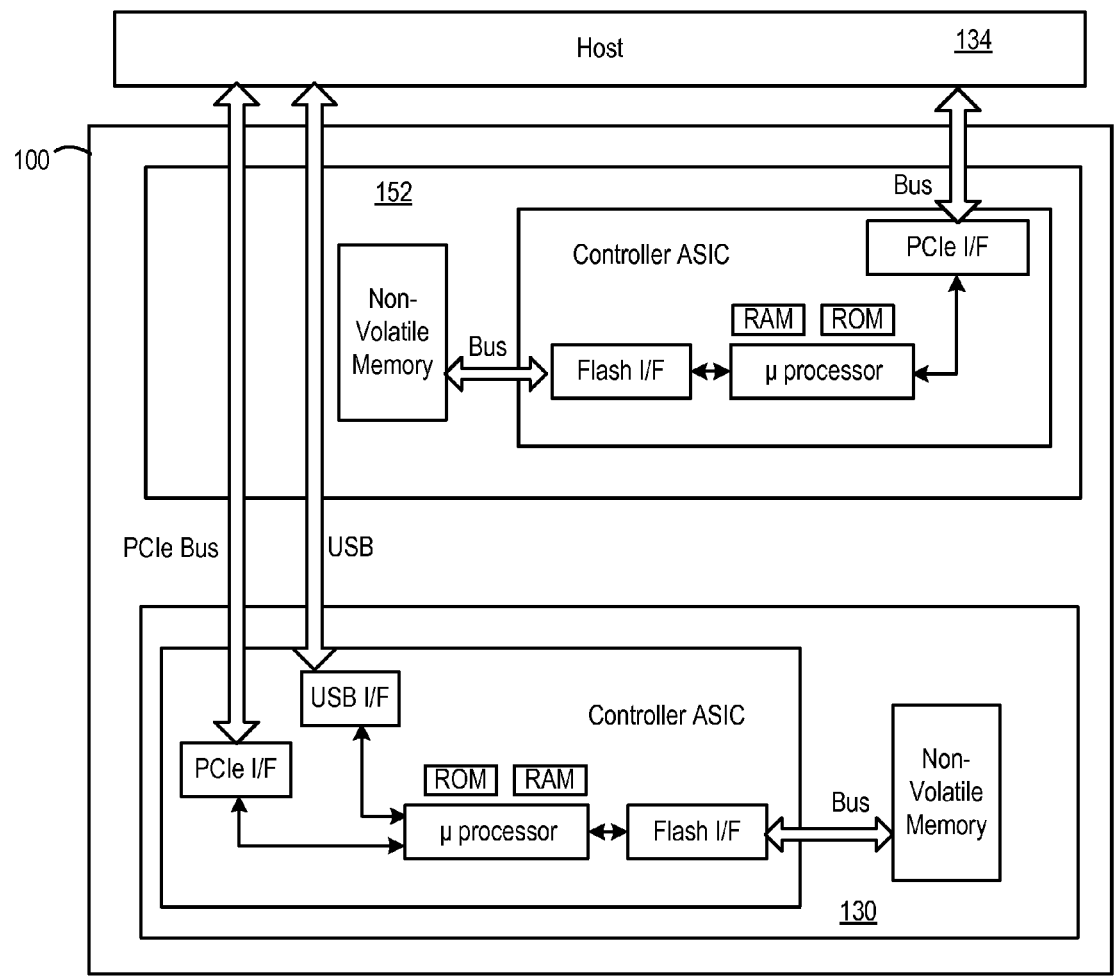

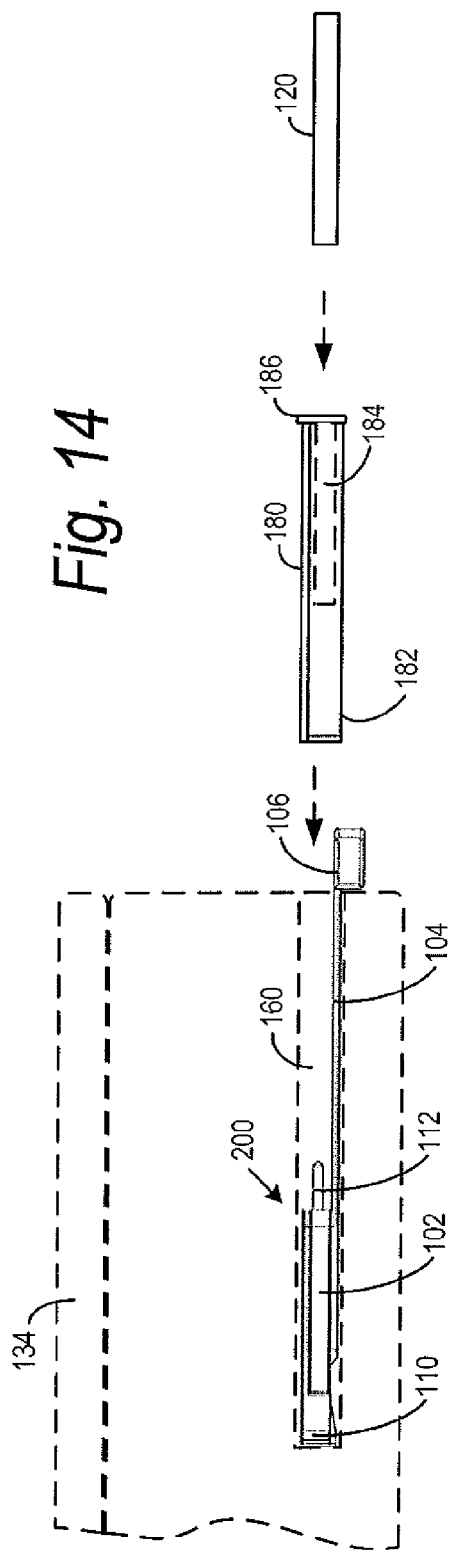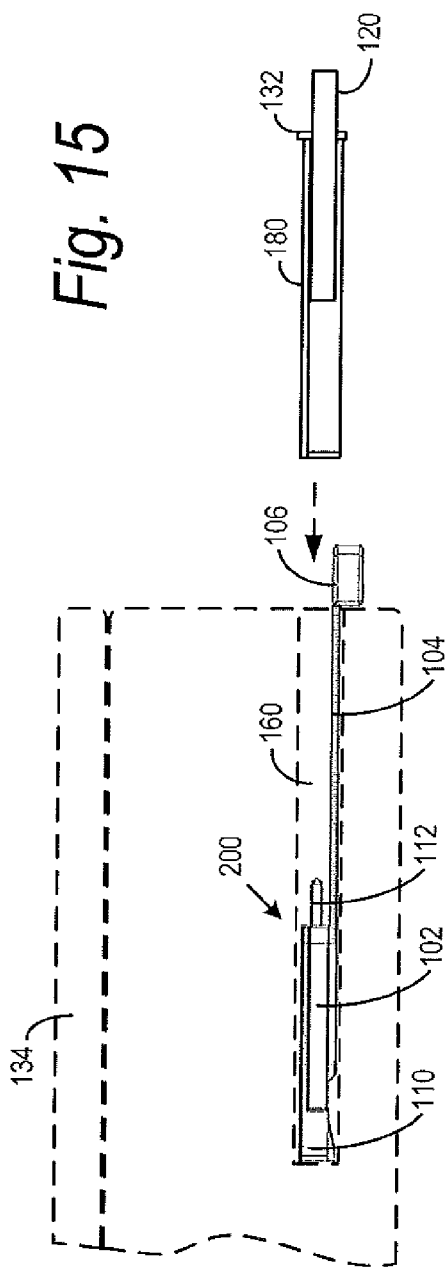

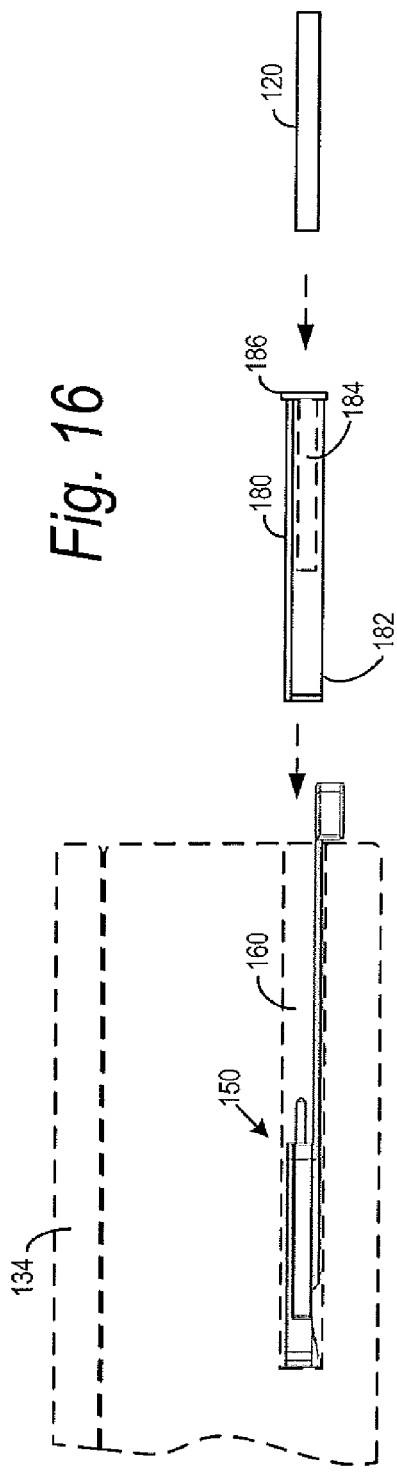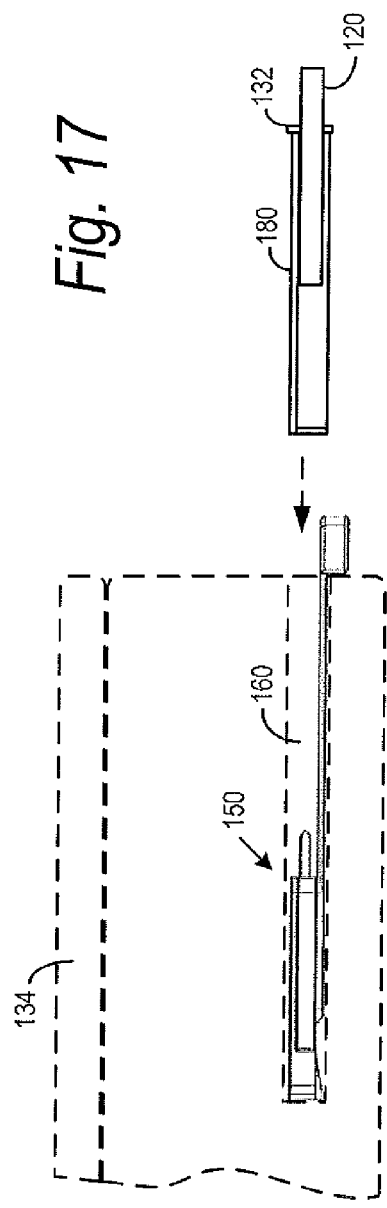

ADAPTER SYSTEM FOR USE WITH AN EXPRESSCARD SLOT

CROSS-REFERENCE TO RELATED APPLICATIONS

The following applications are cross-referenced and incorporated by reference herein in their entirety:

U.S. patent application Ser. No. 11/771,763, entitled "Method of Adapting an ExpressCard Slot for Smaller Form Factor Memory Compatibility," by Jonathan Hubert, et al., filed on even date herewith, now pending as U.S. Publication No. 2009/0006682.

U.S. patent application Ser. No. 11/771,767, entitled "Adapter for an ExpressCard Slot," by Jonathan Hubert, et al., filed on even date herewith, now pending as U.S. Publication No. 2009/0006698.

U.S. patent application Ser. No. 11/771,756, entitled "Memory Card for an ExpressCard Slot," by Jonathan Hubert, et al., filed on even date herewith, now pending as U.S. Publication No. 2009/0002933.

U.S. patent application Ser. No. 11/771,717, entitled "Method of Adapting an ExpressCard Slot for Use with Portable Memory Cards," by Jonathan Hubert, et al., filed on even date herewith, now pending as U.S. Publication No. 2009/0004920.

U.S. patent application Ser. No. 11/771,767, entitled "Method of Using the Dual Bus Interface in An ExpressCard Slot," by Jonathan Hubert, et al., filed on even date herewith, now pending as U.S. Publication No. 2009/0006707.

U.S. patent application Ser. No. 11/771,752, entitled "Dual Bus ExpressCard Peripheral Device," by Jonathan Hubert, et al., filed on even date herewith, now pending as U.S. Publication No. 2009/0006681.

BACKGROUND OF THE INVENTION

1. Field of the Invention

Embodiments of the present invention relate to a peripheral device for using the dual bus interface in an ExpressCard slot, and a method of using same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large storage capacity, have made such memory devices ideal for use in a wide variety of electronic devices, including for example digital cameras, digital music players, video game consoles, PDAs and cellular telephones.

One popular type of flash memory device is the CompactFlash® memory card manufactured by SanDisk Corporation, Milpitas, Calif. While used in a variety of different applications, the CompactFlash memory card has been adopted as the de facto standard in the professional and consumer imaging markets. While there are several reasons why this is so, including the large storage capacity and low cost per megabyte, the form factor of the CompactFlash memory card has proven to be a significant contributing factor. At 43 mm by 36 mm, the card is large enough for easy manipulation, yet small enough for convenient transport and use in current high resolution digital cameras. Professionals and consumers are comfortable with and have grown accustomed to this size memory card.

A few years ago, a coalition of member companies of the Personal Computer Memory Card International Association (PCMCIA) developed the ExpressCard® peripheral as a new standard for PC Card technology. FIG. 1 shows a pair of ExpressCard memory cards 20 and 22 according to the two standard ExpressCard form factors. ExpressCard module 20 has a length of 75 mm and a largest width of 54 mm. ExpressCard module 22 has a length of 75 mm and a width of 34 mm. Both formats are 5 mm thick.

Module 20 is configured under the standard to be received within an ExpressCard slot 24. Module 22 is configured to be received within either slot 24 or a narrower slot 26. In particular, slot 24 includes a guide 28 to steer the module 22 into the correct position to ensure proper nesting of the module 22 upon insertion into the wider slot 24.

One of the advantages of the ExpressCard format over the older PC Card format is the improved data transfer speed due to the use of higher performance serial data interfaces rather than parallel buses. ExpressCard technology uses a simpler connector and eliminates the CardBus controller in PC Card applications by using direct connections to PCI-Express (PCIe) and USB ports in the host platform 30. This lowers the cost of slot implementations in the host platform. However, in order to comply with the ExpressCard standard, it is a requirement that a host platform 30 must support both the PCIe and USB interfaces. This includes a single PCIe lane (x1) operating at the baseline 2.5 Gbps data rate, in each direction, as defined in the PCI Express Base Specification 1.0a by the PCI-SIG, which specification is incorporated herein by reference in its entirety. The host interface must also support the low-, full- and high-speed USB data rates as defined by the USB 2.0 Specification of the USB Implementers Forum, which specification is also incorporated herein by reference in its entirety.

Due to space and cost constraints, host computing platforms 30 typically only include a single ExpressCard slot. In platforms having only a single ExpressCard slot, when an ExpressCard module 20/22 is inserted into the slot, the slot is then no longer available to perform any other functions. This is so despite the fact that the interface has two independent buses—the high performance PCIe bus and the more common USB interface. At present, there are no known peripheral devices that leverage both buses within the same ExpressCard slot.

SUMMARY OF THE INVENTION

Embodiments of the present invention, roughly described, relate to an adapter system including a pair of adapters operating in conjunction with each other to allow a variety of different, off-the-shelf memory cards to be used within the ExpressCard slot. In one embodiment, a first adapter may be part of an adapter assembly configured to fit within an ExpressCard slot. In addition to the first adapter, the adapter assembly includes a tongue rigidly mounted to the first adapter, and a finger grip affixed to the tongue. The first adapter may have a length of 30 mm, a width of 34 mm and a height of 5 mm, and thus fits snugly within a back end of an ExpressCard slot. The first adapter includes a first interface for mating with the ExpressCard slot interface connector, and a second interface for mating with an interface of the second adapter.

The second adapter may have a length of 30 mm, a width of 34 mm and a height of 4 mm and may be configured to fit within a front end of an ExpressCard slot. The second adapter is able to mate with the first adapter, while being positioned over the tongue of the adapter assembly. The second adapter includes a slot, in an end opposite the first adapter, for receiving an off-the-shelf memory card.

The adapter system of the present invention is able to make the ExpressCard slot compatible with any of a variety of off-the-shelf memory cards. In an alternative embodiment, the adapter assembly may be replaced by a memory module assembly so that the ExpressCard slot may operate with a memory module in the memory module assembly and a memory card received within the back of the second adapter. In such embodiments, the memory module and memory card may communicate concurrently with a host device via the dual bus interface of the ExpressCard slot.

DESCRIPTION OF THE DRAWINGS

FIG. 9 is a perspective view of an alternative embodiment of a memory module assembly according to embodiments of the present invention.

FIG. 10 is a side view of the memory module assembly shown in FIG. 9.

FIG. 11 is a perspective view of the memory module assembly according to FIG. 9 adjacent a host device and receiving a second memory module.

FIG. 12 is a high level block diagram of the joined memory modules shown in FIG. 11.

FIG. 13 is a detailed block diagram showing the joined memory modules of FIG. 11.

FIG. 14 is a cross-sectional side view of a host device including an adapter assembly inserted within an ExpressCard slot, and a second adapter for receiving a memory card.

FIG. 15 is a cross-sectional side view of a host computing device including the adapter assembly and second adapter of FIG. 14 with a memory card seated within the second adapter.

FIG. 16 is a cross-sectional side view of a host device including a memory module assembly inserted within an ExpressCard slot, and an adapter for receiving a memory card.

FIG. 17 is a cross-sectional side view of a host computing device including the adapter assembly and second adapter of FIG. 16 with a memory card seated within the second adapter.

DETAILED DESCRIPTION

Embodiments will now be described with reference to FIGS. 2 through 17, which relate to a peripheral device for using the dual bus interface in an ExpressCard slot, and a method of using same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
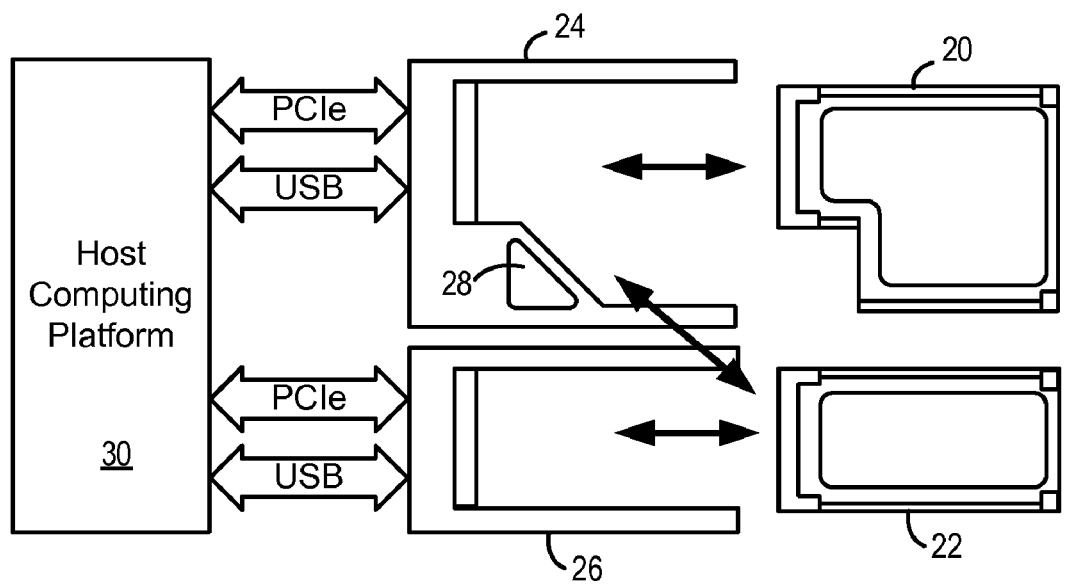
FIG. 1 is schematic representation of a conventional ExpressCard standard memory card system.
Figure 2:
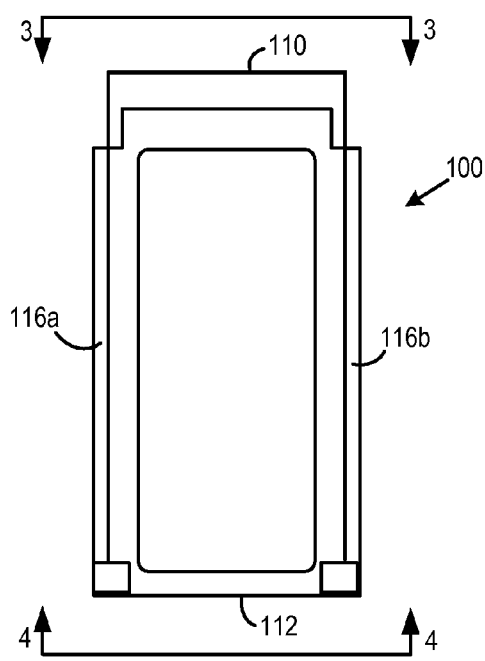
FIG. 2 is a top view of a peripheral device according to an embodiment of the present invention.
Figure 3:
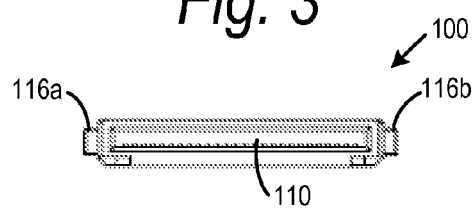
FIG. 3 is a front end view of a peripheral device according to embodiments of the present invention.
Figure 4:
FIG. 4 is a back end view of a peripheral device according to embodiments of the present invention.
Figure 5:
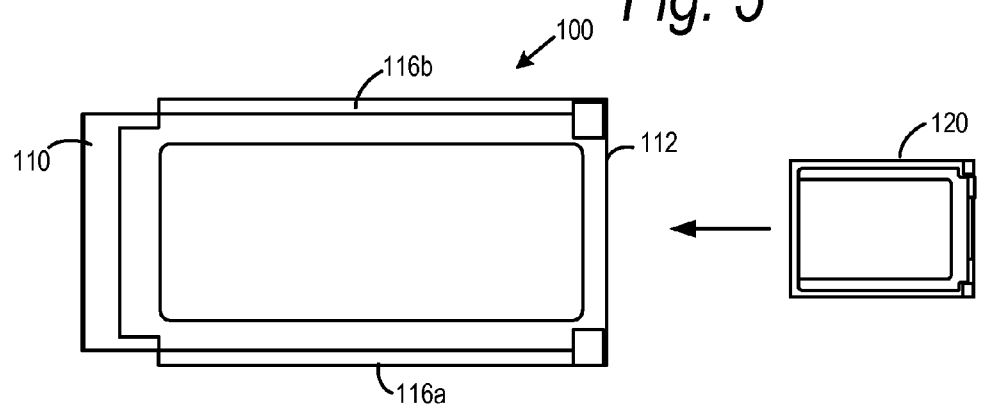
FIG. 5 is a top view of a peripheral device according to an embodiment of the present invention and a memory card positioned to be received therein.
Figure 6:
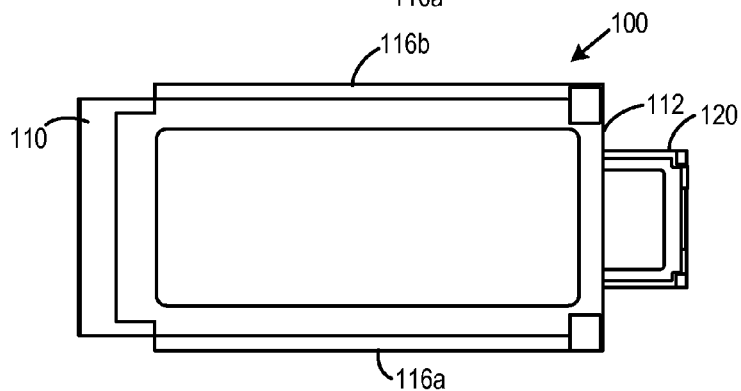
FIG. 6 is a top view of a peripheral device according to embodiments of the present invention including a memory card affixed therein.

Referring now to the top, front end and back end views of FIGS. 2-4, respectively, there is shown a peripheral device 100 for use within a standard ExpressCard slot such as shown in prior art FIG. 1. In general, peripheral device 100 includes an internal memory and a reader for accepting a memory card to enable concurrent data exchange between the internal memory and attached memory card via the dual bus interface of the ExpressCard slot. Each of these features is explained in greater detail hereinafter. Peripheral device 100 may have the dimensions of a standard ExpressCard/34 module; namely, a length of 75 mm, a width of 34 mm and a height of 5 mm. It is understood that peripheral device 100 may have the dimensions of a standard ExpressCard/54 module, or other dimensions, in alternative embodiments.

As seen in FIG. 2 and the view along line 3-3 seen in FIG. 3, a front of the peripheral device 100 includes a front interface 110 including female electrical connectors for mating with pins within a standard ExpressCard slot. As used herein, the "front" of the peripheral device refers to the portion of the device inserted first into the ExpressCard slot and located at the rear of the slot when inserted; the "back" of the peripheral device refers to the portion of the device located at the front opening of the slot when the device is inserted. In embodiments, interface 110 will be configured to mate with the standard, 26 pin, beam-on blade style connector used in the ExpressCard slot. As explained hereinafter, it is contemplated that the peripheral device 100 may be used in other types of card slots which may include other types of interface connectors at a front of the adapter in alternative embodiments.

Referring now to FIGS. 2 through 6, a back end of peripheral device 100 may include a slot 112, as best seen in the view of FIG. 4, taken along line 4-4 in FIG. 2. Slot 112 is configured to receive a memory card 130, which may be any of various memory card standards, such as for example an SD Card, a Smart Media Card, a Mini SD Card, a Transflash memory card, a Memory Stick, a Pico card, an MMC card or an RS-MMC card. Other memory modules are contemplated. As explained hereinafter, a back portion of peripheral device 100 may include a memory card reader for transferring data to and from memory card 130.

Peripheral device 100 may further include side rails 116a and 116b along both edges of device 100. Side rails 116a, 116b serve at least four functions. First, side rails 116a, 116b mate within channels provided in the ExpressCard slot to provide a sturdy, precision feel to a user inserting the peripheral device 100 into the card slot and removing device 100 from the slot. Side rails 116a, 116b may also prevent the device 100 from being inserted up-side-down within the ExpressCard slot. Third, side rails 116a, 116b frictionally engage the channels within the ExpressCard slot to securely hold peripheral device 100 within the ExpressCard slot at all times other than intentional removal of peripheral device 100.

A fourth function of side rails 116a and 116b is to defeat the ejector mechanisms conventionally provided in all ExpressCard slots. In particular, it is known to provide conventional ejector mechanisms within an ExpressCard slot for ejecting memory cards. Such ejector mechanisms include a pushbutton ejector commonly used in older PC Card slots and a so-called "push-push" mechanism where pushing on a back end of a module may secure a module within the ExpressCard slot and, once secured, pushing on the back end of the module again may eject the module from the slot. The functions of ejector mechanisms may be incompatible with a peripheral device according to embodiments of the present invention. In particular, a user may wish to position embodiments of peripheral device 100 within the ExpressCard slot, and leave it there while inserting and removing memory modules which operate with peripheral device 100 (as explained hereinafter). Pushing an ejector button or a memory card within the push-push ejector slot may eject not only the memory card but, inconveniently, the peripheral device 100 as well.

Accordingly, embodiments of the present invention provide "set-it-and-forget-it" functionality to peripheral device 100. That is, a user may insert peripheral device 100 into an ExpressCard slot, and thereafter the user may insert and remove memory cards without any additional actions or attention required by the user to peripheral device 100. This functionality is provided by side rails 116a, 116b, which are configured to disable (i.e., render ineffective) ejector mechanisms provided within an ExpressCard slot.

In order to disable the ExpressCard slot ejector mechanisms, side rails 116a, 116b are provided with a length sufficient to allow sturdy insertion and removal as well as frictional engagement with the ExpressCard slot, but also terminate short of the front section of device 100. In particular, as seen for example in FIG. 2, side rails 116a, 116b extend from a back portion of the peripheral device 100, but terminate short of the front end of the device 100. Conventional ejector mechanisms operate by engaging portions of the front of an ExpressCard memory card. By terminating side rails 116a, 116b short of the front of the device 100, there is no portion of the peripheral device which may be engaged by the ejector mechanisms in a conventional ExpressCard slot.

As some ExpressCard slots may have their ejector mechanisms on the left side and some on the right side, both side rails 116a and 116b terminate before the front of peripheral device 100 to defeat the ejector mechanism whether it is located on the left or right side of the card slot. However, for example where a peripheral device 100 is going to be used within card slots having the ejector mechanism always on the same side, the side rail on that side may terminate short of the front of the device, and the side rail on the opposite side may extend all the way to the front of the device in alternative embodiments. In embodiments, the side rails may accomplish this functionality by terminating 10 mm to 15 mm away from the front end of the peripheral device 100. It is understood that the side rails 116a and 116b may terminate a greater or shorter distance from the front end in alternative embodiments.

Figure 7:
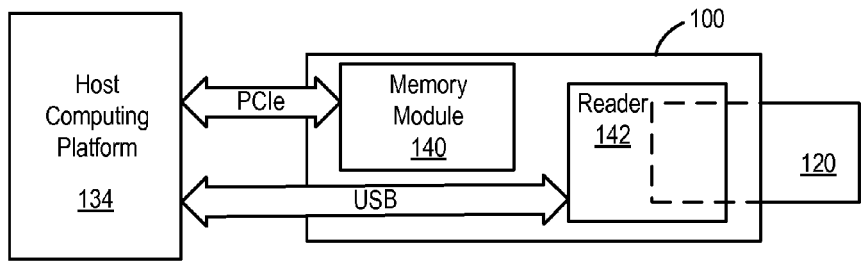
FIG. 7 is a high level block diagram of a peripheral device according to embodiments of the present invention.

Referring now to FIG. 7, there is shown a high level block diagram of peripheral device 100 coupled via the ExpressCard interface to a host computing platform 134. As seen in FIG. 7, the interior peripheral device 100 includes an integrated memory module 140 capable of transferring data to and from host computing platform 134 via the PCIe bus interface of the ExpressCard slot. The interior of peripheral device 100 further includes a reader 142 capable of receiving memory card 120. The reader 142 is capable of transferring data between the host computing platform 134 and card 120 via the USB bus interface of the ExpressCard slot. As used herein, the term "memory module" may refer to an integrated semiconductor memory, as in the case of module 140, or a portable semiconductor memory, as in the case of memory card 120. Memory card 120 may be any of various known memory card standards having a size capable of fitting within the reader 142.

The peripheral device 100 is affixed to host computing platform 134 via interface 110 described above, which may be a 26 pin connector. A first set of those pins are dedicated to the PCIe bus interface, and a second, separate set of pins in interface 110 are dedicated to the USB interface. Thus, peripheral device 100 allows for the exchange of data between host computing platform 134 and memory module 140, as well as host computing platform 134 and memory card 120 via the dual bus interface of the ExpressCard slot. In embodiments, memory module 140 may communicate with the host device over the PCIe interface and the memory card 120 may communicate with the host device over the USB interface. As these communications use separate and independent pathways through interface 110, these communications over the PCIe and USB interfaces may occur concurrently.

Integrated memory module 140 may be located adjacent interface 110 and be electrically connected to the pins of interface 110 located adjacent thereto that are dedicated to the PCIe bus interface. Conversely, reader 142 may be located in a back end of peripheral device 100. The pins of interface 110 dedicated to the USB bus may be electrically coupled to reader 142 via electrical leads passing through peripheral device 100, between interface 110 and reader 142, and passing by memory module 140.

Figure 8:
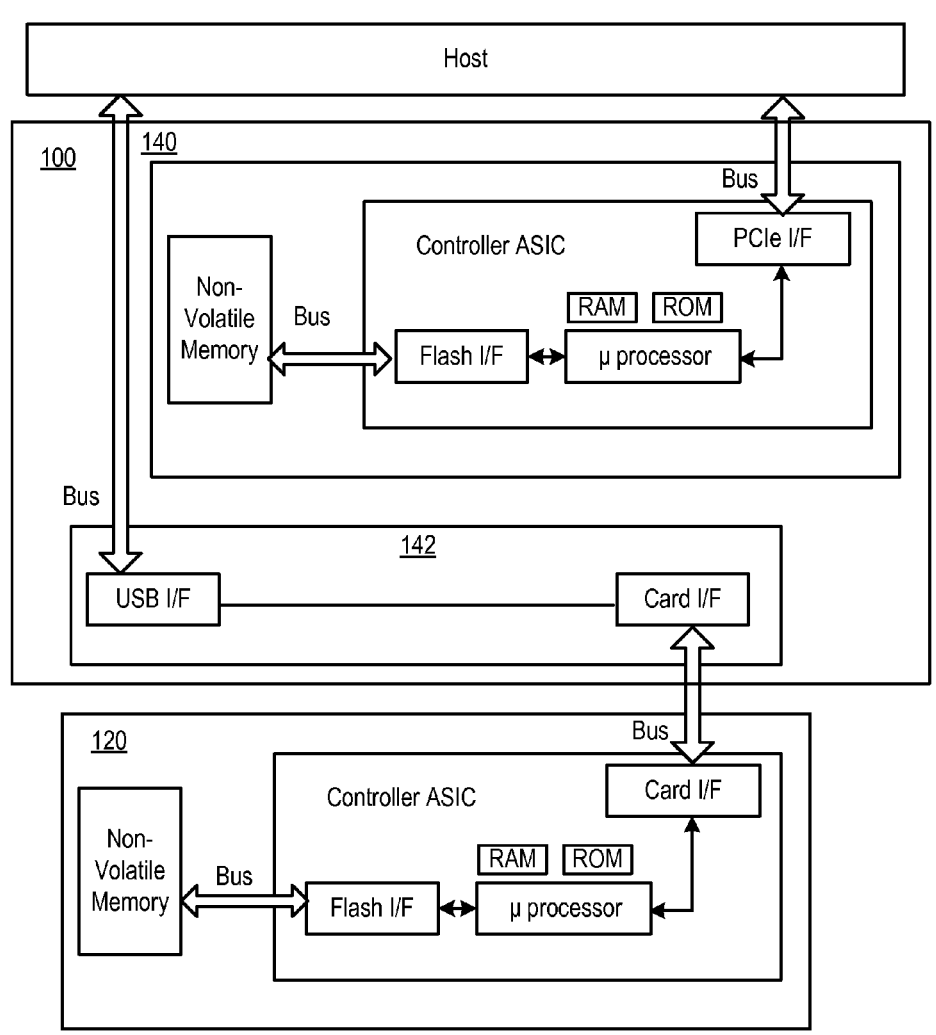
FIG. 8 is a detailed block diagram of a peripheral device according to embodiments of the present invention.

A more detailed block diagram of peripheral device 100 is shown in FIG. 8. As shown in FIG. 8, peripheral device 100 includes memory module 140 and card reader 142, both integrated within the peripheral device 100. As is known in the art, memory module 140 may include a controller such as an ASIC having a microprocessor, RAM, ROM and a flash memory interface for communicating with a nonvolatile flash memory. The controller may further include a PCIe interface for interfacing with the PCIe bus as shown.

As is known in the art, reader 142 may include a memory card interface designed to interface with the type of memory card 120 for which reader 142 is configured. Data may be transferred within the reader 142 between the memory card interface and a USB interface, which is in turn coupled via electrical leads through peripheral device 100 to the USB dedicated portion of interface 110. It is understood that the peripheral device 100 may be configured to operate via the USB interface according to the USB 2.0 specification, the USB 3.0 specification, or any other versions which may now or hereafter be provided.

Memory card 120 may operate in a manner similar to memory module 140. As is known in the art, card 120 may include a controller such as an ASIC having a microprocessor, RAM, ROM and a flash memory interface for communicating with a nonvolatile flash memory. The controller may further include an interface for interfacing with the memory card reader 142 as shown.

In the embodiments described above, peripheral device 100 includes an integrated memory module 140 and an integrated card reader 142 for exchanging data with a host computing device 134 via both buses provided by the ExpressCard standard. In a further embodiment of the present invention, instead of having integrated modules, peripheral device 100 may be formed by first and second memory modules, both of which may be inserted and removed from the ExpressCard slot, and which also may be affixed and detached from each other. Such an alternative embodiment is described below with reference to FIGS. 9-13.

In the embodiments of FIGS. 9-13, peripheral device 100 includes a memory module assembly 150 and a memory card 130. Memory module assembly 150 may be identical to the adapter assembly 100 disclosed in U.S. patent application Ser. No. 11/771,767, entitled "Adapter for an ExpressCard Slot" (previously incorporated by reference) with one exception. Namely, adapter assembly 100 in the incorporated application includes an adapter 102 which is simply a pass-through of electrical leads connecting the front and back interfaces. In the embodiments of FIGS. 9-13 of the present invention, the adapter 102 of the incorporated application is replaced with a memory module 152 similar in operation to memory module 140 described above. Memory module 152 may include a front interface 154 similar to interface 110 described above, and side rails 156a and 156b similar in function to side rails 116a and 116b described above. Memory module 152 may be 45 mm in length, 34 mm in width and 5 mm high to thus fit snugly within the back end of the ExpressCard slot.

Memory module assembly 150 further includes a back end interface 158 including male connectors for mating with and electrically coupling to one of a variety of memory card formats. In one embodiment, interface 158 may be configured to mate with a memory card 130 explained hereinafter, having dimensions of 45 mm long, 34 mm wide and 4 mm thick. For such an application, interface 158 may employ a standard connector, such as the connector used in the ExpressCard slot used for 5 mm thick memory cards, but which has been modified to be thinner so as to operate with a 4 mm thick card. The interface 158 may resemble a standard 5 mm connector in all other respects, such as the number and type of pin contacts and the contact force established by the pin contacts. In alternative embodiments, the memory module assembly 150 according to the present invention may operate with memory cards other than memory card 130, such as for example a CompactFlash memory card, a Secure Digital memory card, or a variety of other standard cards. In such embodiments, interface 158 may be a standard connector for interfacing with these cards.

Memory module assembly 150 further includes a tongue 164 affixed to memory module 152. The tongue 164 may be formed of a rigid material such as for example metal, plastic or other polymer, and may be the same material as or different from the material of housing 114. In embodiments, tongue 164 may have a length of 45 mm so as to extend from memory module 152 to the front opening of the ExpressCard slot. Thus, the memory module 152 and tongue 164 together extend the entire 75 mm length of a standard ExpressCard slot. The width of tongue 164 may be the width of the ExpressCard slot, e.g., 34 mm. It is understood that the width of tongue 164 need not extend across the entire width of the ExpressCard slot and may be less than 34 mm in further embodiments.

The thickness of tongue 164 may for example be 1 mm. As explained hereinafter, a memory card 130 is received within the ExpressCard slot on top of tongue 164. Accordingly, the combined thickness of tongue 164 and the memory card 130 must be less than or equal to the height of an ExpressCard slot, e.g., 5 mm. In embodiments where a memory card 130 is provided having a thickness less than 4 mm, the thickness of tongue 164 may be greater than 1 mm. Alternatively, it is understood that tongue 164 may be thinner than 1 mm in alternative embodiments, with the provision that tongue 164 have sufficient rigidity to transmit an insertion force exerted on grip 166 as explained below.

Finger grip 166 is affixed to tongue 164 and protrudes from the front opening of the memory card slot when the memory module assembly 150 is fully inserted within the slot. Grip 166 is provided for removal, and, in embodiments, insertion of memory module assembly 150. The memory module assembly 150 may be a set-it-and-forget-it device, which does not get displaced upon insertion or removal of a memory card. However, when a user desires, the user may remove the memory module assembly 150 from the ExpressCard slot by grasping the finger grip 166 and manually pulling the memory module assembly 150 out of the slot. Also, as explained above, grip 166 may be held by a user to insert memory module assembly 150 into the fully engaged position within the ExpressCard slot.

Memory card 130 may be specifically adapted to fit within the ExpressCard slot, attached to a back end of the memory module 152. FIG. 11 is a perspective view showing memory module assembly 150 positioned adjacent to a slot 160 of a host device 134. FIG. 11 further shows a memory card 130 adjacent memory module assembly 150. When assembled together, the memory module assembly 150 and card 130 form a peripheral device 100. Memory module assembly 150 may be inserted by itself into slot 160, and thereafter the card 130 inserted into the slot 160. Alternatively, memory card 130 may first be joined to memory module assembly 150, and then the memory module assembly 150 and memory card 130 inserted together into ExpressCard slot 160.

The operation of memory module assembly 150 and memory card 130 will now be described with reference to the high level block diagram of FIG. 12. When both the memory module assembly 150 and memory card 130 are inserted into an ExpressCard slot 160, memory module 152 may exchange data with host platform 134 via the PCIe bus interface, as explained above with respect to integrated memory module 140.

Memory card 130 communicates with the host platform 134 through the memory module assembly 150. In particular, the memory card 130 connects to interface 158 of assembly 150. Interface 158 has pins which are dedicated to the USB interface, and coupled to the USB port of the host platform 134 via electrical leads extending between interface 158 and interface 154 at the front of assembly 150. The electrical leads extend through a housing 162 (FIG. 9) around memory module 152. Thus, when operating with memory module assembly 150, the memory card 130 may use the USB interface of the ExpressCard slot, through the memory module assembly 150.

In a first embodiment described above, a peripheral device 100 has been described including an integrated memory module 140 and an integrated card reader 142 for receiving a memory card. In a second embodiment described above, peripheral device 100 may include first and second memory modules, which may be assembled to each other and which may be removably inserted into an ExpressCard slot. In a further alternative embodiment of the present invention (not shown), a peripheral device 100 may include a first integrated memory module permanently affixed within the peripheral device 100, and a second integrated memory module permanently affixed within the peripheral device. In such an embodiment, the first and second integrated memory modules may communicate with the host platform 134 concurrently over respective PCIe and USB interfaces as explained above.

The present invention discloses an embodiment where memory card 130 operates together with memory module 152 to utilize the two buses of the ExpressCard slot. In such an instance, memory card 130 uses the USB interface. However, it is also contemplated that memory card 130 can operate within ExpressCard slot 160 without memory module 152. In particular, memory card 130 may operate with an adapter assembly 200 (FIGS. 14-15), which may be the same as the adapter assembly 100 disclosed in the previously incorporated patent application entitled "Adapter for an ExpressCard Slot."

Where memory card 130 operates within ExpressCard slot 160 with the adapter assembly 200, the exchange of data between the host computing platform 134 and memory card 130 may take place over the PCIe bus interface. In embodiments, memory card 130 may include a controller capable of identifying when it is affixed to interface 158 of memory module 152, or when it is instead affixed to the adapter assembly 200. When the controller senses that memory card 130 is affixed to memory module 152, the controller may affect the exchange of data via the USB interface. Conversely, when the controller of memory card 130 senses that card 130 is affixed to the adapter assembly 200, the controller may affect the exchange of data over the PCIe bus interface.

A more detailed description of memory module 152 and memory card 130 is now described with reference to the block diagram of FIG. 13. Memory module 152 may include components as are known in the art and as described above with respect to memory module 140 in FIG. 8. Mainly, memory module 152 may include a controller such as an ASIC having a microprocessor, RAM, ROM and a flash memory interface for communicating with a nonvolatile flash memory. The controller may further include a PCIe interface for interfacing with the PCIe bus as shown.

Memory card 130 may have components which are similar to memory card 120 described above with respect to FIG. 8. However, in embodiments of the invention, one difference is that memory card 130 may communicate with host platform 134 via either the PCIe bus or the USB bus, depending on whether memory card 130 is operating with the memory module 152 or the adapter assembly 200. Accordingly, memory card 130 may include a USB interface for communicating with the USB port of host device 134 and a PCIe interface for communicating with the PCIe port of host 134. As indicated above, the controller included as part of memory card 130 may determine whether communications are to take place over the USB interface or the PCIe interface.

Referring now to FIGS. 14 and 15, embodiments of the present invention may include a pair of adapters operating in conjunction with each other to allow a variety of different standard memory cards to be used within ExpressCard slot 160. In particular, in the embodiments described above with respect to FIGS. 9-13, a memory card 130 may be used within an ExpressCard slot 160 via a memory module assembly 150 or via an adapter assembly as described in the above-referenced Adapter patent application. In the embodiment of FIGS. 14 and 15, memory card 130 may be replaced by an adapter 180 as explained below.

FIG. 14 shows a first adapter, adapter assembly 200. Adapter assembly 200 is the same as the adapter assembly 100 disclosed in the above-referenced Adapter patent application (U.S. patent application Ser. No. 11/771,767). As disclosed with respect to adapter assembly 100 in that application, adapter assembly 200 includes an adapter 102, a tongue 104 and a finger grip 106. Adapter 102 includes a first interface 110 at a front of the adapter assembly 200 including female electrical connectors for mating with pins within a standard ExpressCard slot. In embodiments, interface 110 will be configured to receive the standard, 26 pin, beam-on blade style connector used in the ExpressCard slot. Adapter 102 further includes an interface 112 at a back of the adapter 102 including male connectors for mating with and electrically coupling to one of a variety of memory card formats. Tongue 104 may be integrally formed or otherwise attached to adapter 102. The tongue 104 may be formed of a rigid material such as for example metal, plastic or other polymer, and may be the same material as or different from the material of housing 114. In embodiments, tongue 104 may have a length of 45 mm so as to extend from adapter 102 to the front opening of the ExpressCard slot. Thus, the adapter 102 and tongue 104 together extend the entire 75 mm length of a standard ExpressCard slot. The width of tongue 104 may be the width of the ExpressCard slot, e.g., 34 mm. It is understood that the width of tongue 104 need not extend across the entire width of the ExpressCard slot and maybe less than 34 mm in further embodiments. The thickness of tongue 104 may for example be 1 mm. Tongue 104 may connect to finger grip 106 seated on the exterior of the host slot when the adapter assembly 200 is fully inserted. Instead of adapter assembly 200, a memory module assembly 150 as described above, and as described with reference to FIGS. 16 and 17, may be used. FIG. 14 further shows a second adapter, adapter 180. Adapter 180 may have the same form factor and external features as memory card 130. Namely, adapter 180 may have a length of approximately 45 mm, a width of approximately 34 mm and a height of approximately 4 mm.

Adapter 180 may include a front interface 182 capable of mating with a back interface on adapter assembly 200. Adapter 180 may further include a slot 184 for receiving a memory card, such as memory card 120 described above. A lip 184 may also be provided on adapter 180. Lip 184 functions similar to lip 132 in the above-referenced Adapter patent application to prevent adapter 180 from getting lost within the ExpressCard slot 160 in the absence of adapter 200.

Referring now to FIG. 15, memory card 120 may be inserted into adapter 180. Although not shown, an interface at the front of slot 184 may be electrically coupled to interface 182 of adapter 180 to communicate signals from memory card 120 to the back interface of assembly 200. Assembly 200 may in turn transfer these signals to host computing platform 134. In FIG. 15, memory card 120 is shown inserted into adapter 180 prior to adapter 180 being inserted into assembly 200 within the ExpressCard slot 160. In an alternative mode of use, adapter 180 may be inserted into the ExpressCard slot and mated with assembly 200. Thereafter, memory card 120 may be inserted into slot 184 while adapter 180 is seated within the ExpressCard slot. The memory card 120 may be formed according to any of a variety of standard card configurations including for example, an SD Card, a Smart Media Card, a Mini SD Card, a Transflash memory card or a Memory Stick, a Pico card, an MMC card and an RS-MMC card. Other devices are contemplated.

In a still further alternative mode of operation, adapter 180 may be coupled to assembly 200 while assembly 200 is outside of the ExpressCard slot 160. The joined components may then be inserted into the ExpressCard slot 160. The memory card 120 in this embodiment may be affixed within adapter 180 either before or after adapter 180 is affixed to assembly 200.

The embodiment shown in FIGS. 16 and 17 is identical to the embodiment shown in FIGS. 14 and 15, except that adapter assembly 200 is replaced by a memory module assembly 150, as described above for example with respect to FIGS. 9-11. The memory module 150 operates as described above with respect to FIGS. 9-11, except that instead of mating with a second memory module (130 in FIG. 11), the memory module 150 mates with adapter 180 as described above in FIGS. 14 and 15. In embodiments where the assembly used is the memory module assembly 150, the memory module 152 of assembly 150 may communicate over the PCIe bus interface, and memory card 120 may communicate over the USB interface. In embodiments where the assembly used is the adapter assembly 200 (or where some other adapter is used allowing memory card 120 to be used in an ExpressCard slot), memory card 120 may communicate with the host platform 134 over the PCIe bus interface. The memory card 120 may have a controller for determining when the memory module assembly is using the PCIe bus interface, and accordingly direct communications over the USB interface. Where the controller determines that there is no other memory module and that the PCIe bus is not being used, the controller may cause communications to take place over the PCIe bus interface.

Furthermore, in the above-described embodiments, any of various off-the-shelf memory cards may be used within an ExpressCard slot. In an alternative embodiment of the invention, it is further understood that adapter 180 may be used without either of assemblies 150 or 200, within a card slot, other than the ExpressCard slot, sized to receive adapter 180.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An adapter system for adapting a portable memory card for use in an ExpressCard slot, the adapter system comprising:
    an adapter assembly, including:
        a first adapter having a first interface for connecting to the ExpressCard slot and a second interface opposite the first interface,
        a finger grip, spaced from the first adapter, for being gripped by a user in order to remove the adapter assembly from the ExpressCard slot, and
        a tongue rigidly connected between the adapter and finger grip; and
    a second adapter, including:
        a third interface for connecting to the second interface, and
        a slot for receiving the portable memory card.

2. An adapter system as recited in claim 1, wherein the adapter assembly and second adapter together fit within the ExpressCard slot.

3. The adapter system recited in claim 1, wherein the tongue has a low profile and is configured to fit within the ExpressCard slot with the second adapter positioned thereover.

4. The adapter system recited in claim 1, wherein the adapter assembly is configured to allow insertion and removal of the second adapter without displacing the adapter assembly.

5. The adapter system recited in claim 1, wherein the adapter assembly is devoid of structure which may be engaged by an ejector mechanism within the ExpressCard slot.

6. The adapter system recited in claim 1, wherein the second adapter has dimensions approximately that of a CompactFlash card.

7. The adapter system recited in claim 6, wherein the first adapter has a length of about 30 mm and a width of about 34 mm.

8. The adapter system recited in claim 7, wherein the tongue has a length of approximately 45 mm.

9. The adapter system recited in claim 8, wherein the tongue has a thickness of approximately 1 mm.

10. An adapter system for adapting a portable memory card for use in an ExpressCard slot, the adapter system comprising:
    a memory module assembly, including:
        a memory module having a first interface for connecting to the ExpressCard slot and a second interface opposite the first interface,
        a finger grip, spaced from the memory module, for being gripped by a user in order to remove the adapter assembly from the ExpressCard slot, and
        a tongue rigidly connected between the memory module and the finger grip; and
    a second adapter, including:
        a third interface for connecting to the second interface, and
        a slot for receiving the portable memory card.

11. An adapter system as recited in claim 10, wherein the memory module assembly and second adapter together fit within the ExpressCard slot.

12. The adapter system recited in claim 10, wherein the tongue has a low profile and is configured to fit within the ExpressCard slot with the second adapter positioned thereover.

13. The adapter system recited in claim 10, wherein the memory module assembly is configured to allow insertion and removal of the second adapter without displacing the adapter assembly.

14. The adapter system recited in claim 10, wherein the memory module assembly is devoid of structure which may be engaged by an ejector mechanism within the ExpressCard slot.

15. The adapter system recited in claim 10, wherein the second adapter has dimensions approximately that of a CompactFlash card.

16. The adapter system recited in claim 10, wherein the first adapter has a length of about 30 mm and a width of about 34 mm.

17. An adapter system for adapting a portable memory card for use in an ExpressCard slot in a host device, the adapter system comprising:
    a memory module assembly including a memory module having a first interface for connecting to the ExpressCard slot and a second interface opposite the first interface; and
    an adapter, including:
        a third interface for connecting to the second interface of the memory module assembly, and
        a slot for receiving the portable memory card.

18. The adapter system as recited in claim 17, wherein the adapter system communicates signals between the host device and the memory module over the PCIe bus interface of the ExpressCard slot when the memory module assembly is positioned within the ExpressCard slot.

19. The adapter system as recited in claim 17, wherein the adapter system communicates signals over the adapter via the USB interface of the ExpressCard slot when the memory module assembly is positioned within the ExpressCard slot.

20. An adapter system as recited in claim 17, wherein the adapter assembly and second adapter together fit within the ExpressCard slot.

21. The adapter system recited in claim 17, wherein the tongue has a low profile and is configured to fit within the ExpressCard slot with the second adapter positioned thereover.

22. The adapter system recited in claim 17, wherein the adapter assembly is configured to allow insertion and removal of the second adapter without displacing the adapter assembly.

23. The adapter system recited in claim 17, wherein the adapter assembly is devoid of structure which may be engaged by an ejector mechanism within the ExpressCard slot.

24. The adapter system recited in claim 17, wherein the second adapter has dimensions approximately that of a CompactFlash card.

25. The adapter system recited in claim 24, wherein the first adapter has a length of about 30 mm and a width of about 34 mm.

26. The adapter system recited in claim 25, wherein the tongue has a length of approximately 45 mm.

27. The adapter system recited in claim 26, wherein the tongue has a thickness of approximately 1 mm.

28. The adapter system recited in claim 17, wherein the memory module assembly further includes:
   a second finger grip, spaced from the memory module, for being gripped by a user in order to remove the adapter assembly from the ExpressCard slot, and
   a second tongue rigidly connected between the memory and the second finger grip.

29. A method of adapting an ExpressCard slot for use with portable memory cards, comprising the steps of:
   (a) configuring at least substantially all of an adapter assembly to be inserted within the ExpressCard slot, the adapter assembly including a first adapter affixed to a finger grip via a rigid tongue, the first adapter physically mating with an interface of the ExpressCard slot;
   (b) configuring the adapter assembly to receive and physically connect with a second adapter over the tongue when the second adapter is received within the memory card slot; and
   (c) configuring the second adapter to receive and physically mate with one or more of a plurality of portable memory cards.

30. The method recited in claim 29, further comprising the step (d) of configuring the adapter assembly to remain in position within the ExpressCard slot upon removing the portable memory card from the slot.

31. The method recited in claim 29, further comprising the step (d) of configuring the adapter assembly to remain in position within the ExpressCard slot upon removing the second adapter from the slot.

32. The method recited in claim 29, wherein said step (c) of configuring the adapter assembly to remain in position within the ExpressCard slot upon removing the memory card from the slot comprises the step of configuring the adapter assembly to disable an ejector mechanism within the card slot.

33. The method recited in claim 29, wherein said step (a) of configuring at least substantially all of an adapter assembly to be inserted within the ExpressCard slot comprises the step of configuring the adapter assembly to position the finger grip outside of the ExpressCard slot at an opening of the ExpressCard slot upon insertion of the assembly into the ExpressCard slot.

34. The method recited in claim 29, further comprising the step (e) of configuring the adapter assembly to allow removal of the adapter assembly from the ExpressCard slot by pulling on the finger grip.

35. The method recited in claim 29, further comprising the step (f) of transmitting a force exerted on the finger grip to the adapter by the tongue.

36. A method of adapting an ExpressCard slot for use with portable memory cards, comprising the steps of:
   (a) configuring at least substantially all of a memory module assembly to be inserted within the ExpressCard slot, the memory module assembly including a memory module affixed to a finger grip via a rigid tongue;
   (b) configuring the memory module assembly to receive and physically mate with an adapter over the tongue when the adapter is received within the memory card slot; and
   (c) configuring the adapter to receive and physically mate with one or more of a plurality of portable memory cards.

37. The method recited in claim 36, further comprising the step (d) of the memory module communicating over a first bus of the ExpressCard slot, and the one or more of the plurality of portable memory cards communicating over a second bus of the ExpressCard slot.

38. The method recited in claim 36, further comprising the step (e) of configuring the memory module assembly to remain in position within the ExpressCard slot upon removing the portable memory card from the slot.

39. The method recited in claim 36, further comprising the step (e) of configuring the memory module assembly to remain in position within the ExpressCard slot upon removing the adapter from the slot.

40. The method recited in claim 39, wherein said step (e) of configuring the memory module assembly to remain in position within the ExpressCard slot upon removing the portable memory card from the slot comprises the step of configuring the memory module assembly to disable an ejector mechanism within the card slot.

41. The method recited in claim 36, wherein said step (a) of configuring at least substantially all of an memory module assembly to be inserted within the ExpressCard slot comprises the step of configuring the memory module assembly to position the finger grip outside of the ExpressCard slot at an opening of the ExpressCard slot upon insertion of the assembly into the ExpressCard slot.

42. The method recited in claim 36, further comprising the step (f) of configuring the memory module assembly to allow removal of the memory module assembly from the ExpressCard slot by pulling on the finger grip.

43. The method recited in claim 36, further comprising the step (g) of transmitting a force exerted on the finger grip to the adapter by the tongue.

44. A method of adapting an ExpressCard slot in a host device for use with portable memory cards, comprising the steps of:
   (a) configuring at least substantially all of a memory module assembly to be inserted within a back end of the ExpressCard slot, the memory module assembly including a memory module;
   (b) configuring the memory module assembly to receive and physically mate with an adapter within the front end of the ExpressCard slot;
   (c) configuring the adapter to receive and physically mate with one or more of a plurality of portable memory cards;
   (d) transmitting communications between the memory module and the host device via the PCIe bus interface of the ExpressCard slot; and
   (e) transmitting communications between the portable memory card and the host device via the USB interface of the ExpressCard slot concurrently with the transmission of communications between the memory module and the host device via the PCIe bus interface in said step (d).

45. The method recited in claim 44, wherein said step (c) of configuring the adapter to receive one or more of a plurality of portable memory cards comprises the step of configuring the adapter to receive one of an SD Card, a Smart Media Card, a Mini SD Card, a Transflash memory card or a Memory Stick, a Pico card, an MMC card and an RS-MMC card.

46. The method recited in claim 45, further comprising the step (e) of configuring the memory module assembly to remain in position within the ExpressCard slot upon removing the portable memory card from the slot.

47. The method recited in claim 45, further comprising the step (e) of configuring the memory module assembly to remain in position within the ExpressCard slot upon removing the adapter from the slot.

48. The method recited in claim 47, wherein said step (e) of configuring the memory module assembly to remain in position within the ExpressCard slot upon removing the portable memory card from the slot comprises the step of configuring the memory module assembly to disable an ejector mechanism within the card slot.

49. A method of adapting an ExpressCard slot in a host device for use with portable memory cards, comprising the steps of:
  (a) configuring at least substantially all of a memory module assembly to be inserted within a back end of the ExpressCard slot, the memory module assembly including a memory module;
  (b) configuring at least substantially all of an adapter assembly to be inserted within a back end of the ExpressCard slot, the adapter assembly including a first adapter;
  (c) configuring a second adapter to mate with either the memory module assembly configured in said step (a) or the adapter assembly configured in said step (b) within the front end of the ExpressCard slot;
  (d) configuring the adapter to receive one or more of a plurality of portable memory cards;
  (e) transmitting communications between the memory module and the host device via the PCIe bus interface of the ExpressCard slot when the memory module assembly is positioned within the slot;
  (f) transmitting communications between the portable memory card and the host device via the USB interface of the ExpressCard slot when the memory module assembly is positioned within the slot; and
  (g) transmitting communications between the portable memory card and the host device via the PCIe bus interface of the ExpressCard slot when the memory module assembly is positioned within the slot.

50. The method recited in claim 49, further comprising the step (h) of determining when the memory module assembly is positioned within the host, and performing one of said steps (f) or (g) based on the determination in said step (h).

51. The method recited in claim 49, further comprising the step (i) of performing said steps (e) and (f) concurrently when the memory module assembly is positioned within the host.

* * * * *